(12) United States Patent
Fujii et al.

(10) Patent No.: US 6,712,579 B2
(45) Date of Patent: Mar. 30, 2004

(54) SUBSTRATE TRANSFER APPARATUS AND SUBSTRATE TRANSFER METHOD

(75) Inventors: Kenji Fujii, Kyoto (JP); Fuminori Asa, Kyoto (JP); Ryuichi Hayama, Kyoto (JP); Tomoyuki Komura, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/121,778

(22) Filed: Apr. 11, 2002

(65) Prior Publication Data

US 2002/0150459 A1 Oct. 17, 2002

(30) Foreign Application Priority Data

Apr. 17, 2001 (JP) ........................................ 2001-118581

(51) Int. Cl.⁷ .............................................. B66C 23/00
(52) U.S. Cl. .............................. 414/744.5; 414/226.04; 414/782; 414/783
(58) Field of Search ............................. 414/744.5, 936, 414/941, 226.04, 782, 783

(56) References Cited

U.S. PATENT DOCUMENTS 4,973,217 A * 11/1990 Engelbrecht ................ 414/754
5,944,476 A * 8/1999 Bacchi et al. ............... 414/783

FOREIGN PATENT DOCUMENTS

| JP | 2-132840 | 5/1990 | |
|----|----------|--------|---|
| JP | 03034345 A | * 2/1991 | .......... H01L/21/68 |
| JP | 5-3241 | 1/1993 | |
| JP | 5-129417 | 5/1993 | |
| JP | 6-70239 | 9/1994 | |

* cited by examiner

*Primary Examiner*—Eileen D. Lillis
*Assistant Examiner*—Michael Lowe
(74) *Attorney, Agent, or Firm*—Ostrolenk, Faber, Gerb & Soffen, LLP (57) ABSTRACT

A substrate transfer apparatus provided with a first substrate transfer mechanism having a first substrate holding hand which is movable while holding a substrate; and a second substrate transfer mechanism having a second substrate holding hand for receiving and transferring a substrate directly from and to the first substrate holding hand. The apparatus has a positioning mechanism disposed, in a moving passage of a substrate held by the first substrate holding hand, independently from the first substrate transfer mechanism, and having a positioning contact portion for regulating the movement of a substrate such that the substrate is positioned at a predetermined position on the first substrate holding hand.

15 Claims, 6 Drawing Sheets

SUBSTRATE TRANSFER APPARATUS AND SUBSTRATE TRANSFER METHOD

BACKGROUND OF THE INVENTION

1. Field of the Invention

The present invention relates to a substrate transfer apparatus for and a substrate transfer method of transferring any of a variety of substrates such as a semiconductor wafer, a liquid-crystal-display-panel glass substrate, a plasma-display-panel glass substrate, an optical-disk substrate, a magnetic-disk substrate, a photomagnetic-disk substrate and the like.

2. Description of Related Art

A substrate processing apparatus for processing a substrate such as a semiconductor wafer, a liquid-crystal-display-panel glass substrate or the like, comprises a substrate processing unit and an indexer unit connected thereto. The substrate processing unit comprises, for example, a plurality of processing chambers and a main transfer robot to execute a substrate carrying-in/carrying-out operation for carrying an unprocessed substrate in a processing chamber and carrying out a processed substrate from the processing chamber. On the other hand, the indexer unit comprises a cassette placing unit in which a cassette capable of housing a plurality of substrates is housed, and an indexer robot which has access to the cassette placed on the cassette placing unit for carrying-in/carrying-out of a substrate and which also receives/transfers a substrate from/to the main transfer robot.

The indexer robot carries out one unprocessed substrate from the cassette placed in the cassette placing unit and transfers the unprocessed substrate to the main transfer robot. The main transfer robot carries the unprocessed substrate thus received from the indexer robot, in any of the processing chambers. On the other hand, the main transfer robot takes out the processed substrate from a processing chamber and transfers this processed substrate to the indexer robot. The indexer robot houses the processed substrate thus received from the main transfer robot, in the cassette placed in the cassette placing unit.

Transfer of a substrate between the indexer robot and the main transfer robot is conducted with a substrate holding hand of the indexer robot located in a predetermined substrate transfer position. For example, a substrate positioning member of the cylinder drive type is disposed in association with the substrate holding hand of the indexer robot. When this substrate positioning member is driven, the substrate is relatively moved on the substrate holding hand, thus enabling the substrate to be positioned at an accurate position on the substrate holding hand. After the substrate has been thus positioned, the substrate is transferred from the indexer robot to the main transfer robot. As a result, the main transfer robot can hold the substrate in a stable manner. Accordingly, without occurrence of defective transfer (falling of a substrate or the like), the substrate can be transferred between the main transfer robot and the indexer robot and between the main transfer robot and a processing chamber.

The substrate holding hand of the main transfer robot is provided on the top thereof with a substrate supporting member. This substrate supporting member has an arrangement that a tapering face for bringing down a substrate to a predetermined position is formed inside and that a horizontal face joined with the lower end of the tapering face holds the peripheral edge of the underside of the substrate. It is solely the substrate supporting member that positions the substrate on the substrate holding hand of the main transfer robot. No positioning operation is conducted for transfer of a processed substrate from the main transfer robot to the indexer robot.

In the arrangement above-mentioned, the substrate is positioned with the use of the substrate positioning member of the cylinder drive type. This makes the arrangement complicated to prevent the substrate processing apparatus from being reduced in cost. Further, there is required a step of moving the substrate positioning member by a cylinder mechanism to position the substrate. Accordingly, it takes time to transfer the substrate from the indexer robot to the main transfer robot, thus preventing the throughput from being improved.

Further, before transfer of the substrate from the main transfer robot to the indexer robot, no substrate positioning is conducted. Thus, a processed substrate cannot disadvantageously securely be transferred.

SUMMARY OF THE INVENTION

It is an object of the present invention to provide a substrate transfer apparatus and a substrate transfer method, each of which is capable of positioning a substrate on the substrate holding hand with a simple arrangement, thus enabling the production cost to be reduced.

It is another object of the present invention to provide a substrate transfer apparatus and a substrate transfer method, each of which is capable of quickly positioning a substrate on the substrate holding hand, thus enabling the throughput to be improved.

It is a further object of the present invention to provide a substrate transfer apparatus and a substrate transfer method, each of which is capable of previously positioning a substrate not only for transferring the substrate from a first substrate transfer mechanism to a second substrate transfer mechanism, but also for transferring the substrate from the second substrate transfer mechanism to the first substrate transfer mechanism, thus enabling the substrate to be securely transferred.

According to the present invention, a substrate transfer apparatus comprises: a first substrate transfer mechanism (IR) having a first substrate holding hand (11, 12) which is movable while holding a substrate (W); and a first positioning mechanism (71, 72) disposed, in the moving passage of a substrate held by the first substrate holding hand, independently from the first substrate transfer mechanism, and having a positioning contact portion for regulating the movement of a substrate such that the substrate is positioned at a predetermined position on the first substrate holding hand. This substrate transfer apparatus further comprises a second substrate transfer mechanism (CR) having a second substrate holding hand (21, 22) for receiving and transferring a substrate directly from and to the first substrate holding hand.

The alphabets and numerals in the parentheses above-mentioned refer to corresponding component elements in the embodiment to be discussed later. However, it is not meant that the present invention is limited to this embodiment.

According to the present invention, when the first substrate holding hand is moved, the substrate held thereby comes in contact with the positioning contact portion of the first positioning mechanism, resulting in a relative movement of the substrate on the first substrate holding hand. Thus, the substrate can be positioned on the first substrate holding hand.

Since the positioning contact portion can fixedly be disposed in the moving passage of the substrate held by the first substrate holding hand, a cylinder drive mechanism or the like is not required as conventionally done. This simplifies the substrate transfer apparatus in arrangement, enabling the production cost to be lowered. Further, positioning the substrate on the first substrate holding hand can be achieved only by moving the first substrate holding hand. This eliminates a step of driving the substrate positioning member with the use of a cylinder drive mechanism as conventionally done. Thus, the substrate can quickly be positioned. This increases the substrate transfer speed, resulting in improvement in the throughput of a substrate processing apparatus incorporating this substrate transfer apparatus.

Further, the substrate positioned on the first substrate holding hand can securely be transferred to the second substrate holding hand. Positioning the substrate on the first substrate holding hand can quickly be achieved with a simple arrangement. Thus, a direct transfer of the substrate from the first substrate holding hand to the second substrate holding hand, can be achieved at high speed with a low cost.

It is preferable that the first positioning mechanism comprises at least a pair of pins (71, 72) and that the positioning contact portion is disposed at the lateral surface of each of the pair of pins.

According to the arrangement above-mentioned, the first positioning mechanism has a very simple arrangement. That is, by contacting a substrate with the lateral surfaces (positioning contact portions) of a pair of pins, the substrate can be positioned on the first substrate holding hand. The adoption of such a simple arrangement can remarkably reduce the cost of the substrate transfer apparatus. When the first positioning mechanism has at least a pair of (two) pins, a substrate can successfully be positioned on the first substrate holding hand. However, the first positioning mechanism may have for example three or more pins.

The first substrate transfer mechanism may further comprise a regulating member (81–84) for regulating a relative movement of the substrate on the first substrate holding hand, and the first substrate transfer mechanism may be arranged to execute a positioning operation that the first substrate holding hand is moved to cause the substrate thereon to come in contact with the positioning contact portion and that the substrate is further relatively moved toward the regulating member on the first substrate holding hand, thereby to guide the substrate to a predetermined position on the first substrate holding hand.

According to the arrangement above-mentioned, the substrate can accurately be positioned, on the first substrate holding hand, within a predetermined positional range regulated by the regulating member.

The regulating member may be fixed onto the first substrate holding hand.

Preferably, a substrate is transferred from the first substrate holding hand to the second substrate holding hand after the substrate has been positioned on the first substrate holding hand. This securely achieves the transfer of the substrate from the first substrate holding hand to the second substrate holding hand.

The second substrate holding hand is preferably movable while holding a substrate, and there is preferably further disposed a second positioning mechanism (71, 72) disposed, in the moving passage of a substrate held by the second substrate holding hand, independently from the second substrate transfer mechanism, and having a positioning contact portion for regulating the movement of a substrate such that the substrate is positioned at a predetermined position on the second substrate holding hand.

According to the arrangement above-mentioned, a substrate can be positioned on the second substrate holding hand in a manner similar to that in which a substrate can be positioned on the first substrate holding hand. Thus, the transfer of a substrate by the second substrate holding hand can successfully be conducted without occurrence of defective transfer (falling of a substrate or the like). Further, a substrate can accurately be transferred from the second substrate transfer mechanism to the first substrate transfer mechanism.

It is preferable that the second positioning mechanism comprises at least a pair of pins (71, 72), and that the positioning contact portion is disposed at the lateral surface of each of the pair of pins.

According to the arrangement above-mentioned, the second positioning mechanism can be formed in a simple arrangement with a very low cost. When the second positioning mechanism has at least a pair of (two) pins, a substrate can sufficiently be positioned on the second substrate holding hand. However, the second positioning mechanism may have for example three or more pins.

The second substrate transfer mechanism preferably further comprises a regulating member (91 94) for regulating a relative movement of a substrate on the second substrate holding hand, and the second substrate transfer mechanism is preferably arranged to execute a positioning operation that the second substrate holding hand is moved to cause the substrate thereon to come in contact with the positioning contact portion and that the substrate is further relatively moved toward the regulating member on the second substrate holding hand, thereby to guide the substrate to a predetermined position on the second substrate holding hand. According to the arrangement above-mentioned, the substrate can securely be positioned on the second substrate holding hand.

Preferably, a substrate is transferred from the second substrate holding hand to the first substrate holding hand after the substrate has been positioned on the second substrate holding hand. According to the arrangement above-mentioned, the transfer of a substrate from the second substrate holding hand to the first substrate holding hand can securely be executed.

The first positioning mechanism may share the positioning contact portion with the second positioning mechanism. According to the arrangement above-mentioned, the cost can further be reduced.

When there is determined a substrate transfer position (WT) to be used for transfer of a substrate between the first substrate holding hand and the second substrate holding hand, the positioning contact portion which is used in common by the first and second positioning mechanisms, is preferably disposed at a position either at the side of the first substrate holding hand or at the side of the second substrate holding hand with respect to this substrate transfer position. The first substrate transfer mechanism is preferably arranged to execute a positioning operation that the first substrate holding hand is moved from the substrate transfer position to the positioning contact portion, thereby to position the substrate at a predetermined position on the first substrate holding hand, and the second substrate transfer mechanism is preferably arranged to execute a positioning operation that the second substrate holding hand is moved from the substrate transfer position to the positioning contact portion, thereby to position the substrate at a predetermined position on the second substrate holding hand.

According to the arrangement above-mentioned, when each of the first and second substrate holding hands is moved from the substrate transfer position to the positioning contact portion, the substrate thereon can be positioned at a predetermined position. Thus, the same substrate transfer position can be set for transferring a substrate from the first substrate transfer mechanism to the second substrate transfer mechanism and for transferring a substrate from the second substrate transfer mechanism to the first substrate transfer mechanism. Further, the positioning contact portion used for positioning a substrate can commonly be used for positioning a substrate on the first substrate holding hand and for positioning a substrate on the second substrate holding hand. This is advantageous in view of cost reduction.

According to the present invention, a substrate transfer method comprises: a step of holding a substrate by a first substrate holding hand of a first substrate transfer mechanism (IR); and a step of positioning the substrate at a predetermined position on the first substrate holding hand by moving the first substrate holding hand which holds the substrate, while regulating the movement of the substrate by a positioning contact portion (71, 72) disposed independently from the first substrate transfer mechanism. This substrate transfer method further comprises a step of transferring, after the positioning step above-mentioned, the substrate from the first substrate holding hand of the first substrate transfer mechanism to a second substrate holding hand of a second substrate transfer mechanism.

A method according to an embodiment of the present invention further comprises: a step of holding a substrate by the second substrate holding hand of the second substrate transfer mechanism (CR); a step of positioning the substrate at a predetermined position on the second substrate holding hand by moving the second substrate holding hand which holds the substrate, while regulating the movement of the substrate by a positioning contact portion (71, 72) disposed independently from the second substrate transfer mechanism; and a step of transferring, after this positioning step, the substrate from the second substrate holding hand to the first substrate holding hand.

According to the method above-mentioned, a substrate is previously positioned prior to its transfer not only from the first substrate holding hand to the second substrate holding hand, but also from the second substrate holding hand to the first substrate holding hand. Thus, the substrate can securely be transferred. As above-mentioned, provision may be made such that the positioning contact portion is used for bi-directional transfers of the substrate. This prevents the cost from being increased.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
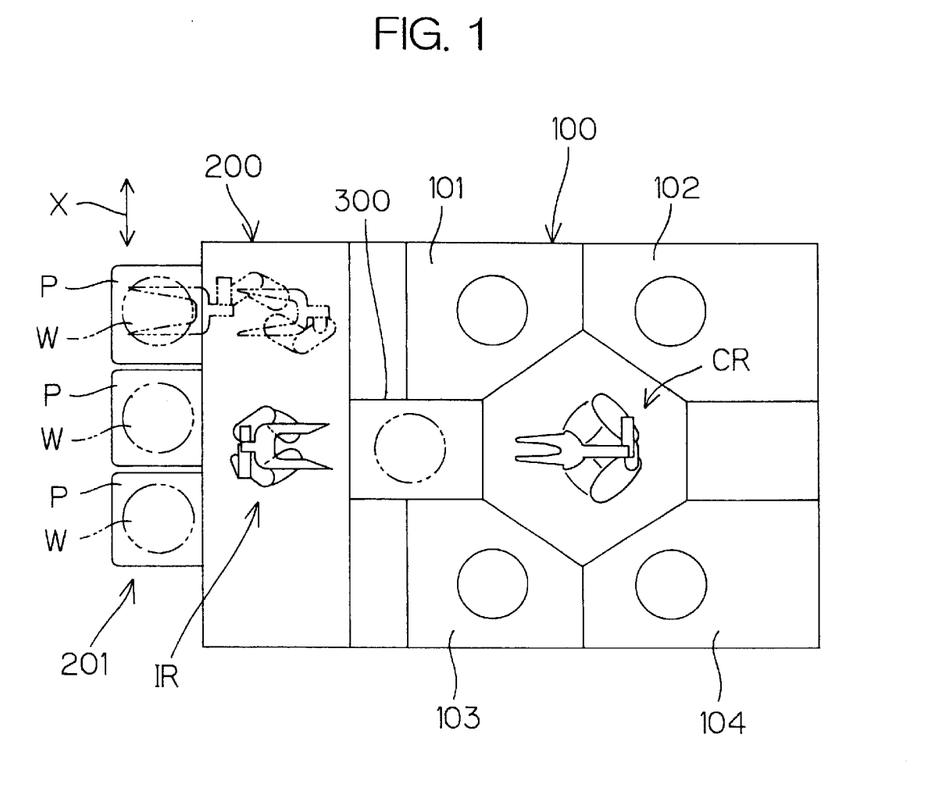
FIG. 1 is a schematic plan view illustrating the layout of a substrate processing apparatus to which an embodiment of the present invention is applied.

FIG. 1 is a schematic plan view illustrating the layout of a substrate processing apparatus to which an embodiment of the present invention is applied. This substrate processing apparatus is arranged to execute a variety of processings such as a washing processing, an etching processing and the like, on a semiconductor wafer W as an example of a substrate (hereinafter simply referred to as wafer). This substrate processing apparatus comprises a substrate processing unit 100 and an indexer unit 200 connected thereto.

The substrate processing unit 100 comprises a plurality of (four in this embodiment) processing chambers 101, 102, 103, 104, and a main transfer robot CR disposed at the center of these processing chambers 101~104 as surrounded thereby. This main transfer robot CR is capable of receiving and transferring a wafer W from and to the indexer unit 200 and also capable of carrying a wafer W in and out from any of the processing chambers 101~104.

The indexer unit 200 has (i) a wafer station 201 in which there are placed wafers W housed in pods P as rectangular parallelepiped lidded containers, and (ii) an indexer robot IR capable of carrying a wafer W in and out from a pod P placed in the wafer station 201 and also capable of receiving and transferring a wafer W from and to the main transfer robot CR. The wafer station 201 is arranged such that a plurality of (three in this embodiment) pods P are placed in a direction X. Each pod P houses a cassette (not shown) which can house, in lamination, a plurality of wafers W. Each pod P is provided at the front thereof facing the indexer robot IR with a removable lid. Provision is made such that this lid is automatically removed/attached by a removing/attaching mechanism (not shown).

The indexer robot IR can travel in the direction in which the pods P are disposed in the wafer station 201, i.e., in the direction X. Accordingly, the indexer robot IR can not only move to the front of an optional pod P, but also move to the front of the transfer portion 300 where a wafer W is received from and transferred to the main transfer robot CR.

Figure 2:
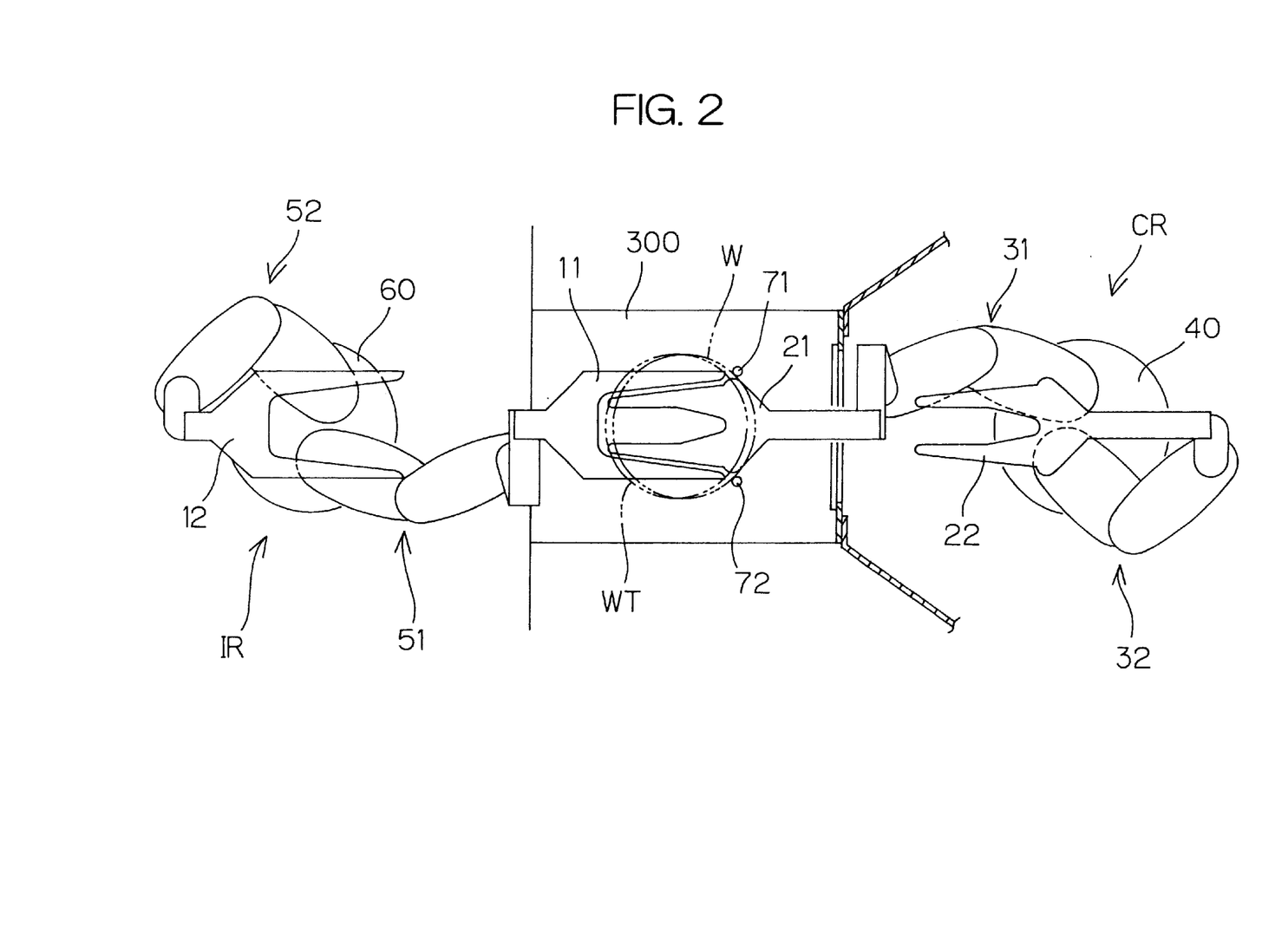
FIG. 2 is an enlarged plan view illustrating how a wafer is transferred between an indexer robot and a main transfer robot.

FIG. 2 is an enlarged plan view illustrating how a wafer W is transferred between the indexer robot IR and the main transfer robot CR. The main transfer robot CR has a pair of hands 21, 22 for holding a wafer W, advance/retreat drive mechanisms 31, 32 for mutually independently advancing/retreating these hands 21, 22 with respect to a base stand 40, a rotational drive mechanism (not shown) for rotationally driving the base stand 40 around the perpendicular axis (axis vertical to the paper plane of FIG. 2), and a vertical-movement drive mechanism (not shown) for raising and lowering the base stand 40 in the perpendicular direction. Each of the advance/retreat drive mechanisms 31, 32 is of the multi-joint arm type for horizontally advancing and retreating the hands 21, 22 while maintaining the postures thereof. Provision is made such that one hand 21 advances/retreats above the other hand 22 and that these hands 21, 22 overlap each other in the vertical direction at the initial state where both hands 21, 22 are retreated above the base stand 40.

The indexer robot IR has a pair of hands 11, 12 for holding a wafer W, advance/retreat drive mechanisms 51, 52 for mutually independently advancing/retreating these hands 11, 12 with respect to a base stand 60, a rotational drive mechanism (not shown) for rotationally driving the base stand 60 around the perpendicular axis, a vertical-movement drive mechanism (not shown) for raising and lowering the base stand 60, and a horizontal drive mechanism for horizontally moving the whole indexer robot IR in the direction X (See FIG. 1) Each of the advance/retreat drive mechanisms 51, 52 is of the multi-joint arm type for horizontally advancing and retreating the hands 11, 12 while maintaining the postures thereof. One hand 11 is located above the other hand 12, and these hands 11,12 overlap each other in the vertical direction at the initial state where both hands 11, 12 are retreated above the base stand 60.

Each of the hands 11, 12 of the indexer robot IR and the hands 21, 22 of the main transfer robot CR, is made in the form of a fork. The hands 11, 12 of the indexer robot IR are substantially the same in shape, and the hands 21, 22 of the main transfer robot CR are substantially the same in shape. The hands 11, 12 of the indexer robot IR and the hands 21, 22 of the main transfer robot CR are formed such that the hands 11, 12 substantially mesh with the hands 21, 22 in plan elevation. Thus, a wafer W can directly be transferred between the hands 11, 21 or between the hands 12, 22. More specifically, at the transfer portion 300, the hand 11 of the indexer robot IR can receive a wafer W directly from the hand 21 of the main transfer robot CR. Likewise, at the transfer portion 300, the hand 12 of the indexer robot IR can transfer a wafer W directly to the hand 22 of the main transfer robot CR.

The transfer of a wafer W from the hand 21 of the main transfer robot CR to the hand 11 of the indexer robot IR, is achieved in the manner that the wafer W held by the hand 21 is picked up, from under, by the hand 11 of the indexer robot IR. At this time, the ascent of the base stand 60 causes the hand 11 to be moved from a position slightly under the hand 21 to a position above the hand 21. At this time, no interference between the hands 11 and 21 occurs.

On the other hand, for transferring a wafer W from the hand 12 of the indexer robot IR to the hand 22 of the main transfer robot CR, the hand 12 advances to and waits at the transfer portion 300 with the wafer W held by the hand 12, and the hand 22 of the main transfer robot CR advances to the transfer portion 300 and picks up, from under, the wafer W on the hand 12. More specifically, the ascent of the base stand 40 causes the hand 22 to be moved from a position slightly under the hand 12 to a position above the hand 12. In this rising stage, the hand 22 receives the wafer W from the hand 12. At this time, no interference between the hands 12 and 22 occurs.

In the indexer robot IR and the main transfer robot CR, the upper hands 11, 21 are used for holding a wafer W processed at any of the processing chambers 101~104, while the lower hands 12, 22 are used for holding an unprocessed wafer W taken out from a pod P. Thus, different hands are respectively used for a processed wafer W and an unprocessed wafer W. This prevents particles attached to an unprocessed wafer W from being transferred to a processed wafer W. Further, since a processed wafer W is held by the upper hands 11, 12, there is no possibility of particles falling from an unprocessed wafer W being again attached to a processed wafer W.

The transfer portion 300 has a pair of positioning pins 71, 72 which stand in a perpendicular direction. These positioning pins 71, 72 are arranged to position a wafer W at a predetermined position on the hands 12, 21 before the wafer W is transferred between the hands 11, 12 of the indexer robot IR and the hands 21, 22 of the main transfer robot CR. The positioning pins 71, 72 are disposed as positionally shifted, by a very small distance, to the side of the main transfer robot CR with respect to a wafer transfer position WT.

When transferring an unprocessed wafer W from the hand 12 of the indexer robot IR to the hand 22 of the main transfer robot CR, the indexer robot IR advances the hand 12, before such a transfer, in the direction from the transfer position WT to the positioning pins 71, 72, thus causing the wafer W held by the hand 12 to come in contact with the positioning pins 71, 72. The hand 12 is advanced to a predetermined relative position with respect to the positioning pins 71, 72. Accordingly, if the wafer W is located in a wrong position on the hand 12, the wafer W comes in contact with the positioning pins 71, 72, and is then relatively moved on the hand 12 and guided to a predetermined position as the hand 12 moves. Thereafter, the indexer robot IR retreats the hand 12 by a very small distance. This causes the wafer W held by the hand 12 to be guided to the transfer position WT. Thereafter, the main transfer robot CR advances the hand 22 to the transfer portion 300 and the hand 22 picks up, from under, the unprocessed wafer W on the hand 12.

On the other hand, when transferring a processed wafer W from the hand 21 of the main transfer robot CR to the hand 11 of the indexer robot IR, the main transfer robot CR advances the hand 21, before such a transfer, to a position such that the peripheral end surface of the processed wafer W is securely positioned at the side of the indexer robot IR with respect to the positioning pins 71, 72. At this time, the height of the base stand 40 is set such that the hand 21 or the processed wafer W does not interfere with the positioning pins 71, 72. Thereafter, the base stand 40 is lowered and the hand 21 is retreated to the base stand 40.

If the processed wafer W is located in a wrong position on the hand 21, the retreat movement of the hand 21 causes the processed wafer W to come in contact with the positioning pins 71, 72 and be relatively moved on the hand 21. As a result, the processed wafer W is guided to a predetermined position on the hand 21. Thereafter, the main transfer robot CR advances the hand 21 by a very small distance, causing the processed wafer W held by the hand 21 to be guided to the transfer position WT. Thereafter, the indexer robot IR advances the hand 11 and the hand 11 picks up, from under, the processed wafer W on the hand 21.

When the indexer robot IR holds the processed wafer W at the hand 11, the indexer robot IR retreats the hand 11 to a position above the base stand 60 and then moves to the front of a pod P which is to house the processed wafer W. Then, the base stand 60 is rotated around the perpendicular axis such that the hands 11, 12 respectively face the target pods P. Then, the hand 11 is advanced to the target pod P such that the processed wafer W is housed in the pod P. Before or after this, the hand 12 is advanced to the target pod P and carries out an unprocessed wafer W therefrom.

The indexer robot IR holding the unprocessed wafer W at the hand 12, moves to the front of the transfer portion 300. The rotation of the base stand 60 causes the hands 11, 12 to face the transfer position WT. At this state, the unprocessed wafer W is transferred from the hand 12 to the hand 22 of the main transfer robot CR before or after the processed wafer W is transferred from the hand 21 to the hand 11.

When the main transfer robot CR receives the unprocessed wafer W, the base stand 40 is rotated such that the hands 21, 22 are turned to a processing chamber, out of the processing chambers 101~104, in which a processing has been finished. The hand 21 carries out the processed wafer W from this processing chamber. Thereafter, the hand 22 carries the unprocessed wafer W in this processing chamber.

Thereafter, with the hands 21, 22 facing the transfer portion 300, the main transfer robot CR stands ready for transfer of the processed wafer W to the indexer robot IR.

Figure 3:
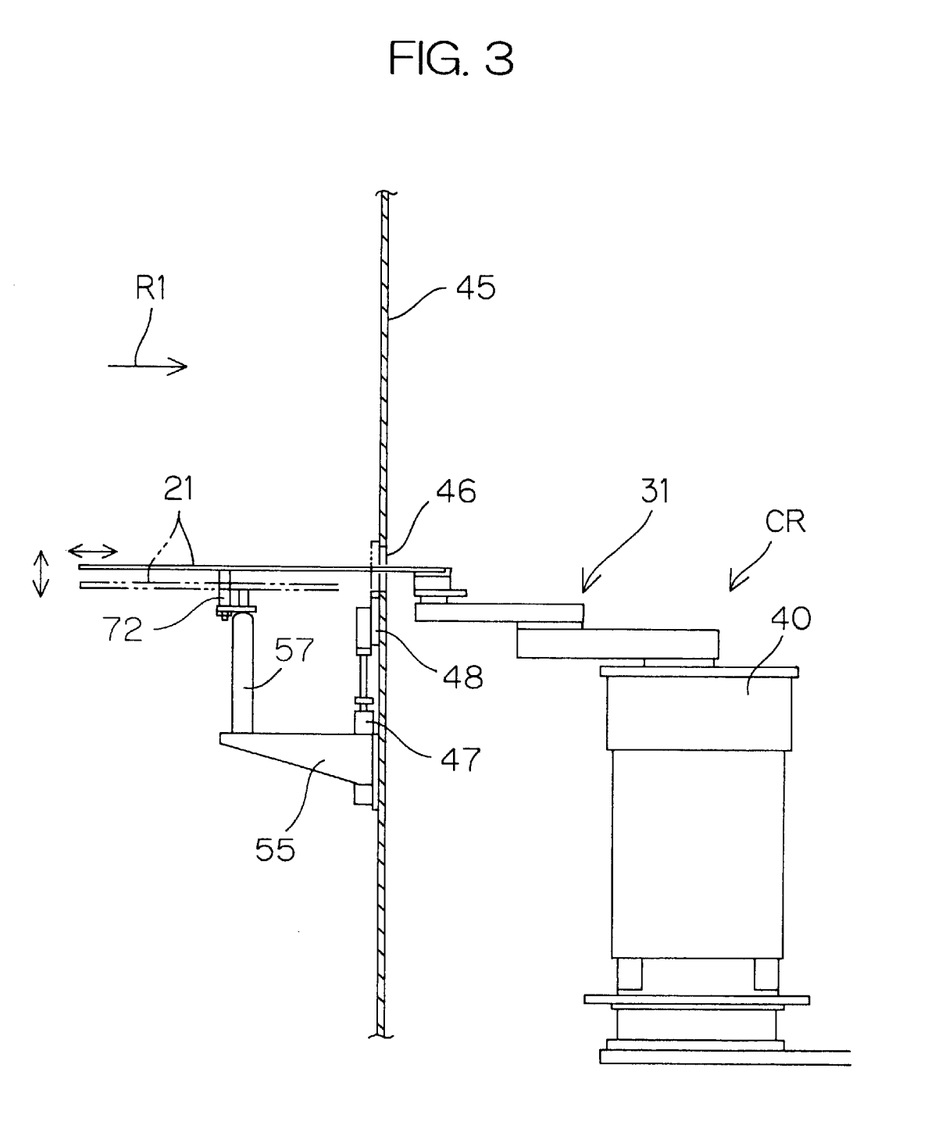
FIG. 3 is a section view illustrating the arrangement in the vicinity of a positioning pin.
Figure 4:
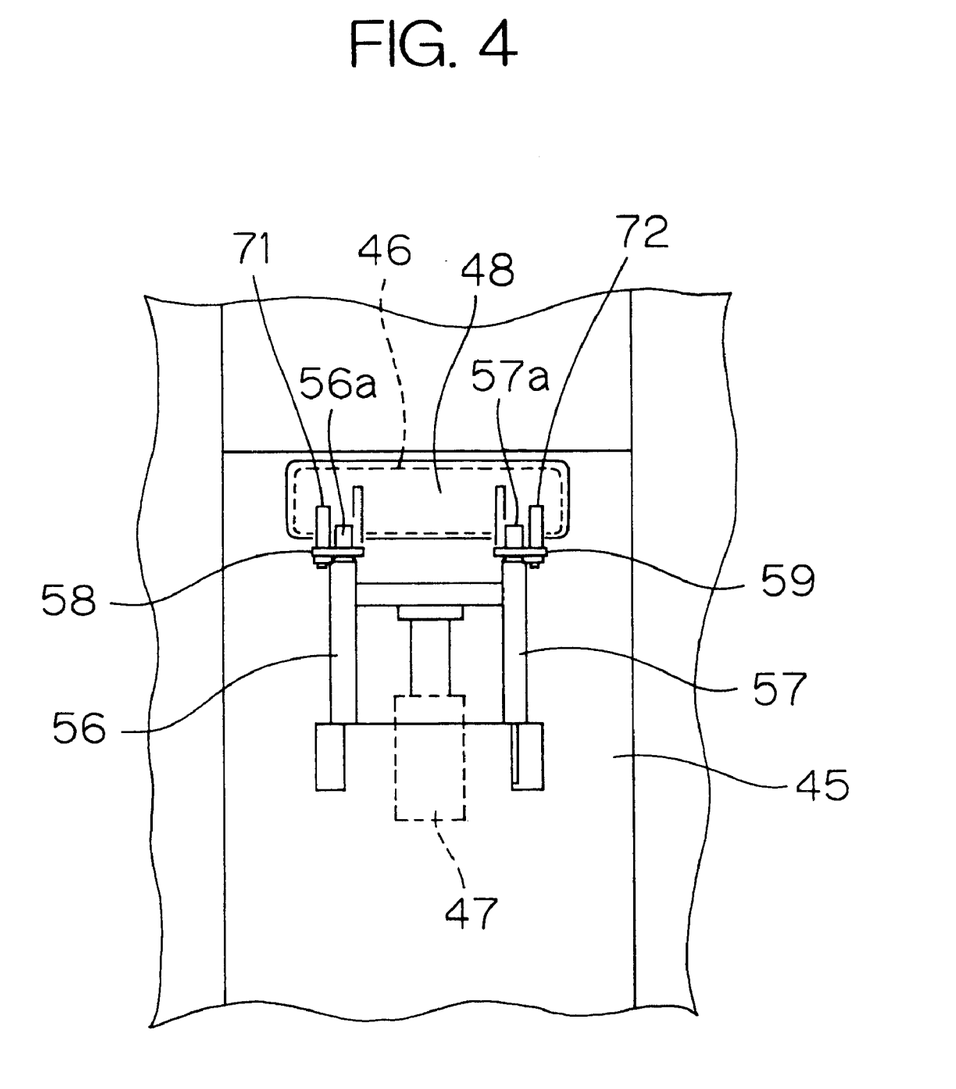
FIG. 4 is a side view taken along the direction of an arrow R1 in FIG. 3.

FIG. 3 is a section view illustrating the arrangement in the vicinity of the positioning pin 72, while FIG. 4 is a side view taken along the direction of an arrow R1 in FIG. 3. A partitioning wall 45 is disposed for partitioning the inside space of the transfer portion 300 from the space in which the main transfer robot CR is disposed. This partitioning wall 45 is provided in a predetermined position thereof with a slot-like opening 46 through which a wafer W is to be taken in and out. There is disposed a shutter plate 48 to be vertically moved by an air cylinder 47 with respect to this opening 46. The shutter plate 48 opens the opening 46 only when transferring a wafer W between the indexer robot IR and the main transfer robot CR, and otherwise closes the opening 46. The hands 21, 22 of the main transfer robot CR enter the inside space of the transfer portion 300 through the opening 46.

A bracket 55 is attached to the surface of the partitioning wall 45 at the side of the transfer portion 300. As shown in FIG. 4, a pair of support pins 56, 57 vertically stand on the bracket 55. Small-diameter portions 56a, 57a are formed in the vicinity of the upper ends of the support pins 56, 57. Fixtures 58, 59 are respectively attached to the small-diameter portions 56a, 57a. The positioning pins 71, 72 stand on the fixtures 58, 59, respectively. By adjusting the mounting angle and mounting height of the fixtures 58, 59 with respect to the support pins 56, 57, the plane position and height of the positioning pins 71, 72 can finely be adjusted. These positioning pins 71, 72 are column-like rod bodies, of which cylindrical lateral faces serve as positioning contact portions which come in contact with the peripheral end face of a wafer W.

Figures 5A, 5B:
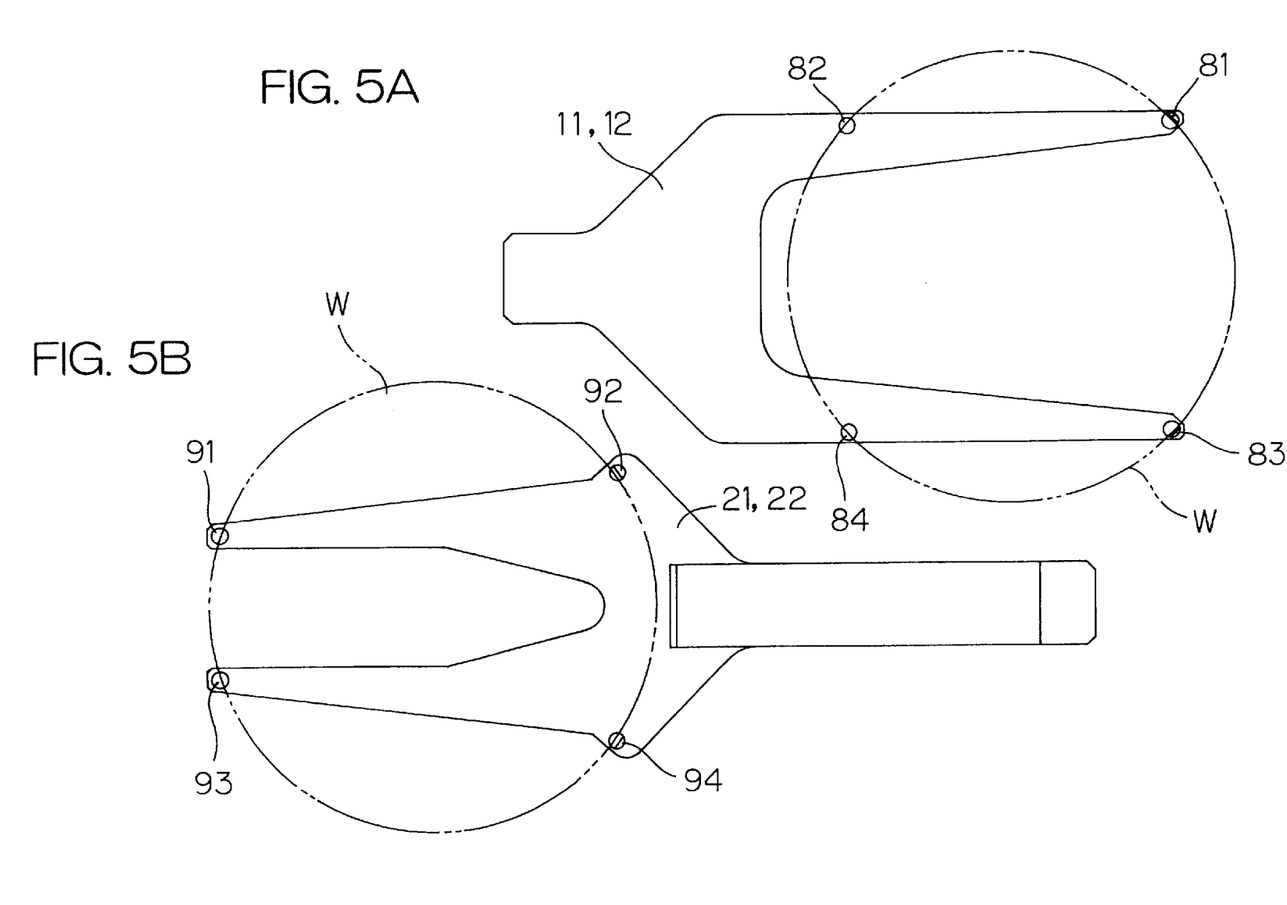
FIG. 5A and FIG. 5B are enlarged plan views respectively illustrating the arrangements of the hand of the indexer robot and the hand of the main transfer robot.

FIG. 5A and FIG. 5B are enlarged plan views respectively illustrating the arrangements of the hand 11, 12 of the indexer robot IR and the hand 21, 22 of the main transfer robot CR. The hand 11, 12 of the indexer robot IR is provided at four positions of the top thereof with wafer support members 81, 82, 83, 84. These wafer support members 81~84 are arranged to support the peripheral edge portion of the underside of a wafer W and face the peripheral end face thereof, thus regulating a relative horizontal movement of the wafer W on the hand 11, 12. Likewise, the hand 21, 22 of the main transfer robot CR is provided on the top thereof with wafer support members 91, 92, 93, 94. These wafer support members 91~94 are arranged to support the peripheral edge portion of the underside of a wafer W and face the peripheral end face thereof, thus regulating a relative horizontal movement of the wafer W on the hand 21, 22.

Figure 6:
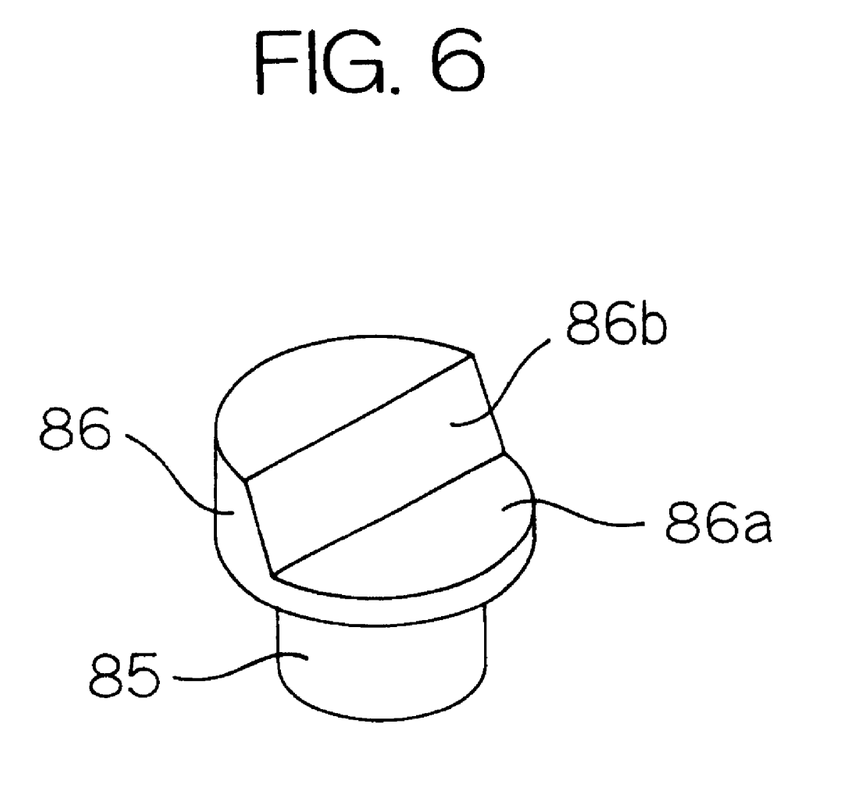
FIG. 6 is a perspective view of a wafer supporting member.

Each of the wafer support members 81~84, 91~94 has an arrangement for example shown in FIG. 6. More specifically, each of the wafer support members 81~84, 91~94 has a column-like fixing portion 85 to be fixed to the hand 11, 12, 21, 22, and a main body 86 disposed on the fixing portion 85 as connected thereto. The main body 86 has a support face 86a substantially horizontal when the main body 86 is fixed to the hand 11, 12, 21, 22, and a tapering face 86b inclinedly upwardly standing from the support face 86a. The support face 86a supports the underside of the peripheral edge portion of a wafer W, while the tapering face 86b regulates a horizontal movement thereof.

The indexer robot IR advances the hand 12 to cause the wafer W to come in contact with the lateral faces of the positioning pins 71, 72 for positioning the wafer W. At this time, a relative movement of the wafer W is regulated by the tapering faces 86b of the wafer support members 82, 84 disposed at the base side of the hand 12. This enables the wafer W to be securely positioned at a predetermined position on the hand 12.

Likewise, when the main transfer robot CR retreats the hand 21 toward the positioning pins 71, 72, a relative horizontal movement of a wafer W in contact with the lateral faces of the positioning pins 71, 72, is regulated by the tapering faces 86b of the wafer support members 91, 93 disposed at the tip side of the hand 21. This enables the wafer W to be securely positioned on the hand 21.

According to the embodiment having the arrangement above-mentioned, a wafer W can previously be positioned, prior to its transfer between the indexer robot IR and the main transfer robot CR, by the positioning pins 71, 72 which are securely disposed, in the transfer portion 300, independently from the indexer robot IR and the main transfer robot CR. Thus, a wafer W can be positioned with a very simple arrangement, enabling the production cost to be remarkably reduced. Further, as compared with the arrangement in which the substrate positioning member is driven with the use of a cylinder, this wafer positioning by the movement of the hand 12, 21 can be achieved at higher speed, thus improving the throughput. Further, a wafer W is previously positioned not only before transferring the wafer W from the indexer robot IR to the main transfer robot CR, but also before transferring the wafer W from the main transfer robot CR to the indexer robot IR. This effectively prevents defective wafer transfer.

In the foregoing, an embodiment of the present invention has been discussed, but the present invention can also be embodied in a different manner. For example, in the embodiment above-mentioned, a pair of positioning pins 71, 72 are commonly used for positioning both a wafer W on the hand 12 and a wafer W on the hand 21. However, for example positioning pins for positioning a wafer W on the hand 21 may separately be disposed at positions at the side of the indexer robot IR with respect to the transfer position WT.

In the embodiment above-mentioned, a pair of positioning pins 71, 72 are disposed at positions at the side of the main transfer robot CR with respect to the transfer position WT. However, these positioning pins 71, 72 may be disposed at positions at the side of the indexer robot IR with respect to the transfer position WT. In such an arrangement, the indexer robot IR will position a wafer W by retreating the hand 12 in the direction from the transfer position WT to the positioning pins 71, 72. On the other hand, the main transfer robot CR will position a wafer W by advancing the hand 21 in the direction from the transfer position WT to the positioning pins 71, 72.

Further, the description has been made of an embodiment in which each of the indexer robot IR and the main transfer robot CR is of the double-hand type having a pair of hands 11, 12; 21, 22. However, the indexer robot IR and/or the main transfer robot CR may be a robot of the single-hand type having only one hand.

Further, the embodiment above-mentioned is arranged such that a wafer W is positioned beforehand not only when transferring a wafer W from the indexer robot IR to the main transfer robot CR, but also when transferring a wafer W from the main transfer robot CR to the indexer robot IR. However, provision may be made such that a wafer positioning operation is executed beforehand only when transferring a wafer W from the indexer robot IR to the main transfer robot CR.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application corresponds to Japanese Patent Application Serial No. 2001-118581 filed on Apr. 17, 2001 with the Japanese Patent Office, the disclosure of which is incorporated herein by reference.

What is claimed is:

1. A substrate transfer apparatus comprising:
   a first substrate transfer mechanism having a first substrate holding hand which is movable while holding a substrate, and a regulating member for regulating a relative movement of the substrate on the first substrate holding hand;
   a second substrate transfer mechanism having a second substrate holding hand for receiving and transferring a substrate directly from and to the first substrate holding hand; and
   a first positioning mechanism disposed, in a moving passage of a substrate held by the first substrate holding hand, independently from the first substrate transfer mechanism, and having a positioning contact portion for regulating a movement of a substrate such that the substrate is positioned at a predetermined position on the first substrate holding hand;
   wherein the first substrate transfer mechanism is arranged to execute a positioning operation such that the first substrate holding hand is moved to cause the substrate thereon to come in contact with the positioning contact portion and such that the substrate is further relatively moved toward the regulating member on the first substrate holding hand, thereby to guide the substrate to a predetermined position on the first substrate holding hand.

2. A substrate transfer apparatus according to claim 1, wherein the first positioning mechanism includes at least a pair of pins, and
   the positioning contact portion is disposed at a lateral surface of each of the pair of pins.

3. A substrate transfer apparatus according to claim 1, wherein a substrate is transferred from the first substrate holding hand to the second substrate holding hand after the substrate has been positioned on the first substrate holding hand.

4. A substrate transfer apparatus according to claim 1, wherein the second substrate holding hand is movable while holding a substrate,
   the substrate transfer apparatus further comprising a second positioning mechanism disposed, in a moving passage of a substrate held by the second substrate holding hand, independently from the second substrate transfer mechanism, and having a positioning contact portion for regulating a movement of a substrate such that the substrate is positioned at a predetermined position on the second substrate holding hand.

5. A substrate transfer apparatus according to claim 4, wherein the second positioning mechanism comprises at least a pair of pins, and
   the positioning contact portion is disposed at a lateral surface of each of the pair of pins.

6. A substrate transfer apparatus according to claim 4, wherein a substrate is transferred from the second substrate holding hand to the first substrate holding hand after the substrate has been positioned on the second substrate holding hand.

7. A substrate transfer apparatus according to claim 4, wherein the first positioning mechanism shares the positioning contact portion with the second positioning mechanism.

8. A substrate transfer apparatus according to claim 7, wherein there is determined a substrate transfer position for transferring a substrate between the first substrate holding hand and the second substrate holding hand,
   the positioning contact portion is disposed at a position either at a side of the first substrate holding hand or at a side of the second substrate holding hand with respect to the substrate transfer position, the positioning contact portion being shared by the first positioning mechanism and the second positioning mechanisms,
   the first substrate transfer mechanism is arranged to execute a positioning operation that the first substrate holding hand is moved from the substrate transfer position to the positioning contact portion, thereby to position the substrate at a predetermined position on the first substrate holding hand, and
   the second substrate transfer mechanism is arranged to execute a positioning operation that the second substrate holding hand is moved from the substrate transfer position to the positioning contact portion, thereby to position the substrate at a predetermined position on the second substrate holding hand.

9. A substrate transfer apparatus comprising:
   a first substrate transfer mechanism having a first substrate holding hand which is movable while holding a substrate;
   a second substrate transfer mechanism having a second substrate holding hand for receiving and transferring a substrate directly from and to the first substrate holding hand, the second substrate holding hand being movable while holding the substrate, the second substrate transfer mechanism further including a regulating member for regulating a relative movement of a substrate on the second substrate holding hand;
   a first positioning mechanism disposed, in a moving passage of a substrate held by the first substrate holding hand, independently from the first substrate transfer mechanism, and having a positioning contact portion for regulating a movement of a substrate such that the substrate is positioned at a predetermined position on the first substrate holding hand; and
   a second positioning mechanism disposed, in a moving passage of a substrate held by the second substrate holding hand, independently from the second substrate transfer mechanism, and having a positioning contact portion for regulating a movement of a substrate such that the substrate is positioned at a predetermined position on the second substrate holding hand;
   wherein the second substrate transfer mechanism is arranged to execute a positioning operation that the second substrate holding hand is moved to cause the substrate thereon to come in contact with the positioning contact portion and that the substrate is further relatively moved toward the regulating member on the second substrate holding hand, thereby to guide the substrate to a predetermined position on the second substrate holding hand.

10. A substrate transfer apparatus comprising:
a substrate transfer mechanism having a substrate holding hand which is movable while holding a substrate, and a regulating member for regulating a relative movement of the substrate on the substrate holding hand; and
a positioning mechanism disposed, in a moving passage of a substrate held by the substrate holding hand, independently from the substrate transfer mechanism, the positioning mechanism including a positioning contact portion for regulating a movement of a substrate such that the substrate is positioned at a predetermined position on the substrate holding hand;
wherein the substrate transfer mechanism is arranged to execute a positioning operation that the substrate holding hand is moved to cause the substrate thereon to come in contact with the positioning contact portion and that the substrate is further relatively moved toward the regulating member on the substrate holding hand, thereby to guide the substrate to a predetermined position on the substrate holding hand.

11. A substrate transfer apparatus according to claim 10, wherein the positioning mechanism includes at least a pair of pins; and the positioning contact portion is disposed at a lateral surface of each of the pair of pins.

12. A substrate transfer method, comprising:
a step of holding a substrate by a first substrate holding hand of a first substrate transfer mechanism;
a first positioning step of positioning the substrate at a predetermined position on the first substrate holding hand by moving the first substrate holding hand which holds the substrate, while regulating a movement of the substrate by a positioning contact portion disposed independently from the first substrate transfer mechanism; and
a step of directly transferring, after the first positioning step, the substrate from the first substrate holding hand of the first substrate transfer mechanism to a second substrate holding hand of a second substrate transfer mechanism;
a step of providing a regulating member for regulating a relative movement of the substrate on the first substrate holding hand,
the first substrate positioning step including a step of causing the first substrate holding hand to move so that the substrate thereon comes in contact with the positioning contact portion and thereafter relatively moves toward the regulating member on the first substrate holding hand, thereby to guide the substrate to a predetermined position on the first substrate holding hand.

13. A substrate transfer method according to claim 12 further comprising:
a step of holding a substrate by the second substrate holding hand of the second substrate transfer mechanism;
a second positioning step of positioning the substrate at a predetermined position on the second substrate holding hand by moving the second substrate holding hand which holds the substrate, while regulating a movement of the substrate by a positioning contact portion disposed independently from the second substrate transfer mechanism; and
a step of transferring, after the second positioning step, the substrate from the second substrate holding hand to the first substrate holding hand.

14. A substrate transfer method, comprising:
a step of holding a substrate by a first substrate holding hand of a first substrate transfer mechanism;
a first positioning step of positioning the substrate at a predetermined position on the first substrate holding hand by moving the first substrate holding hand which holds the substrate, while regulating a movement of the substrate by a positioning contact portion disposed independently from the first substrate transfer mechanism;
a step of directly transferring, after the first positioning step, the substrate from the first substrate holding hand of the first substrate transfer mechanism to a second substrate holding hand of a second substrate transfer mechanism; and
a second positioning step of positioning the substrate at a predetermined position on the second substrate holding hand by moving the second substrate holding hand which holds the substrate, while regulating a movement of the substrate by a positioning contact portion disposed independently from the second substrate transfer mechanism;
a step of providing a regulating member for regulating a relative movement of the substrate on the second substrate holding hand,
the second substrate positioning step including a step of causing the second substrate holding hand to move so that the substrate thereon comes in contact with the positioning contact portion and thereafter relatively moves toward the regulating member on the second substrate holding hand, thereby to guide the substrate to a predetermined position on the second substrate holding hand.

15. A substrate transfer method, comprising:
a step of holding a substrate by a substrate holding hand of a substrate transfer mechanism; and
a positioning step of positioning the substrate at a predetermined position on the substrate holding hand by moving the substrate holding hand which holds the substrate, while regulating a movement of the substrate by a positioning contact portion disposed independently from the substrate transfer mechanism;
a step of providing a regulating member for regulating a relative movement of the substrate on the substrate holding hand,
the substrate positioning step including a step of causing the substrate holding hand to move so that the substrate thereon comes in contact with the positioning contact portion and thereafter relatively moves toward the regulating member on the substrate holding hand, thereby to guide the substrate to a predetermined position on the substrate holding hand.

* * * * *